United States Patent
Lee et al.

(10) Patent No.: US 6,480,388 B1
(45) Date of Patent: Nov. 12, 2002

(54) BACK PLATE ASSEMBLY FOR MOTHERBOARD

(75) Inventors: Tsung-Lung Lee, Tu-Chen (TW); Cheng-Tien Lai, Tu-Chen (TW); Zili Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/103,004

(22) Filed: Mar. 20, 2002

(51) Int. Cl.[7] .................................................. H05K 7/20
(52) U.S. Cl. ....................... 361/704; 165/80.3; 257/719; 361/710; 361/719; 361/720
(58) Field of Search ............................ 165/80.2, 80.3, 165/185; 174/16.3; 257/718–719, 726–727; 361/704, 707, 709–710, 719–721, 753, 759; 24/453, 458; 248/505, 510

(56) References Cited

U.S. PATENT DOCUMENTS

| | | | | |
|---|---|---|---|---|
| 5,883,782 A | * | 3/1999 | Thurston et al. | 361/704 |
| 5,883,783 A | * | 3/1999 | Turturro | 361/704 |
| 5,894,408 A | * | 4/1999 | Stark et al. | 361/704 |
| 6,141,220 A | * | 10/2000 | Lin | 361/704 |

* cited by examiner

Primary Examiner—Gregory Thompson
(74) Attorney, Agent, or Firm—Wei Te Chung

(57) ABSTRACT

A back plate assembly includes a back plate (40) for being attached to an underside of a motherboard (20), a plurality of posts (60), and a plurality of clips (80). The motherboard defines a plurality of through apertures (22). The back plate defines a plurality of through holes (48). Each clip defines a star-shaped cutout (82) in a middle of a round base (82) thereof, to thereby form a plurality of inwardly extending resilient teeth (84). The teeth slant upwardly from a periphery of the base toward a middle of the cutout. In assembly, the posts are extended through the corresponding through holes and through apertures. The clips are then placed on top ends of the posts and downwardly pushed until the clips abut the motherboard. The teeth are elastically deformed to thereby securely retain the posts in the motherboard. The back plate is thus securely attached to the motherboard.

13 Claims, 3 Drawing Sheets

BACK PLATE ASSEMBLY FOR MOTHERBOARD

BACKGROUND OF THE INVENTION

1. Field of the Invention

The present invention relates to back plate assemblies, and particularly to back plate assemblies for facilitating mounting of components onto motherboards.

2. Prior Art

Computer electronic devices such as central processing units (CPUs) frequently generate large amounts of heat, which can destabilize operation and cause damage. A heat sink placed in thermal contact with an electronic device transfers heat from the electronic device through conduction. Modern heat sinks are being made larger and larger. Therefore, a back plate is often attached on an underside of a motherboard below an electronic device mounted on the motherboard. The back plate reinforces the motherboard.

FIGS. 3–4 show a conventional back plate 1 for attachment below a motherboard 14, the motherboard 14 having a heat sink assembly 10 secured thereon. The back plate 1 comprises a base 2, and four U-shaped protrusions 3 extending from comers of the base 2. Each protrusion 3 defines a cutout 4 in an outmost extremity thereof. The motherboard 14 defines four through holes (not labeled). The heat-sink assembly 10 comprises four hollow poles 12 depending from an underside thereof.

In assembly, the heat sink assembly 10 is attached on the motherboard 14 with the poles 12 extending through the through holes of the motherboard 14. The back plate 1 is then attached to an underside of the motherboard 14, with the cutouts 4 of the back plate 1 in communication with the corresponding through holes of the motherboard 14. The poles 12 extend through the corresponding cutouts 4. Screws 16 are then extended through the corresponding cutouts 4 to engage in the hollow poles 12.

The heat sink assembly 10 and the back plate 1 are secured to the motherboard 14 with the screws 16. The assembly process is unduly laborious. Furthermore, the back plate 1 and the motherboard 14 cannot be pre-assembled prior to attachment of the heat sink assembly 10 onto the motherboard 14. Particularly in mass-production facilities, the assembly process is time-consuming and inconvenient.

SUMMARY OF THE INVENTION

Accordingly, an object of the present invention is to provide a back plate assembly which comprises a back plate pre-assembled to a motherboard.

To achieve the above-mentioned object, a back plate assembly in accordance with the present invention comprises a back plate, a plurality of posts and a plurality of clips. The back plate is attached on an underside of a motherboard for reinforcing the motherboard. The motherboard defines a plurality of through apertures. The back plate defines a plurality of through holes. Each clip comprises a round base. A star-shaped cutout is stamped in a middle of the base. A plurality of inwardly extending resilient teeth is thereby formed in the base. The teeth slant upwardly from a periphery of the base toward a middle of the cutout.

In assembly, the posts are extended through the corresponding through holes and through apertures. The clips are then placed on top ends of the posts and downwardly pushed until the clips abut the motherboard. The teeth are elastically deformed to thereby securely retain the posts in the motherboard. The back plate is thus securely attached to the motherboard.

Other objects, advantages and novel features of the present invention will be drawn from the following detailed description of a preferred embodiment of the present invention with attached drawings, in which:

DESCRIPTION OF THE PREFERRED EMBODIMENT

Figure 1:
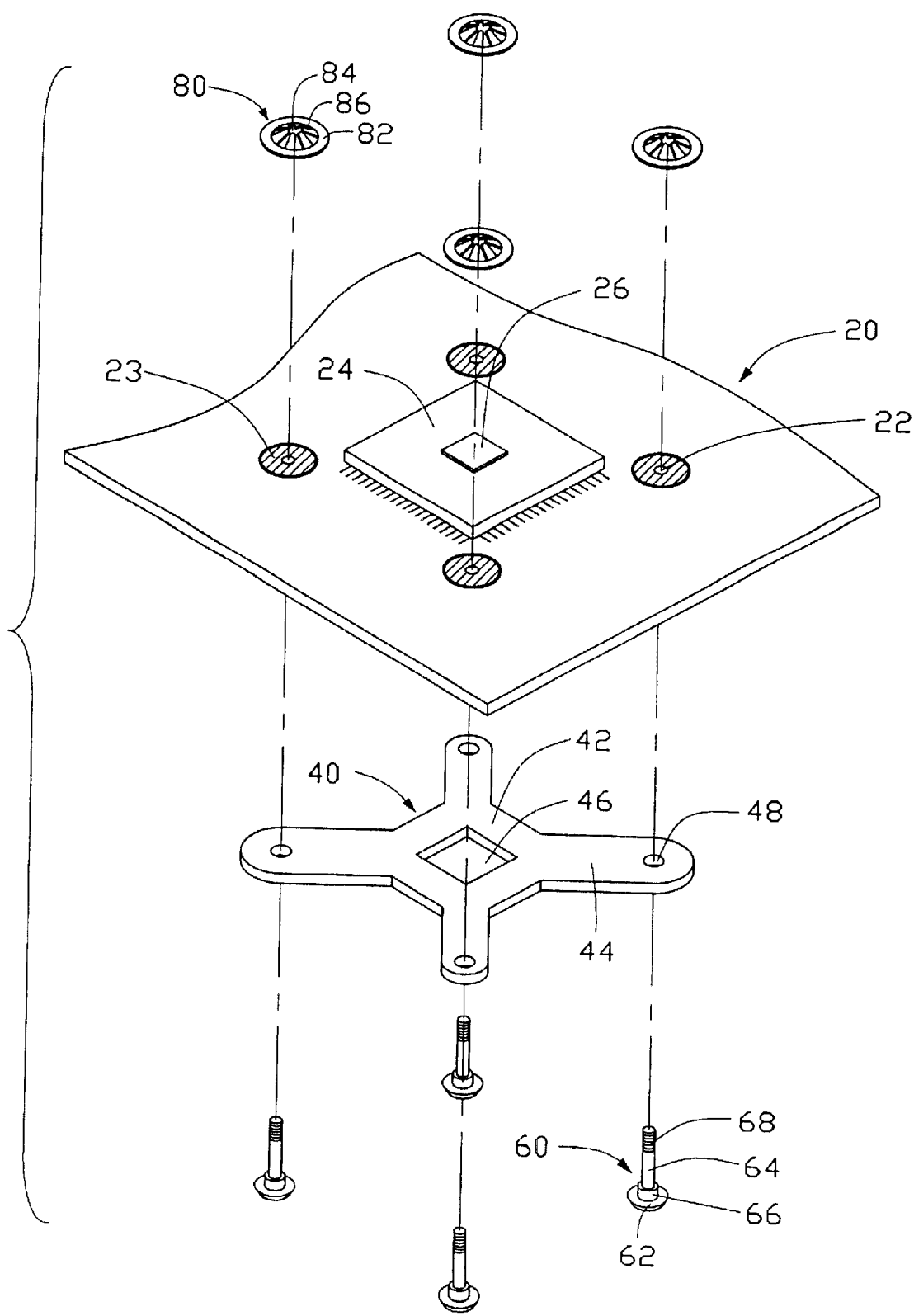
FIG. 1 is an exploded perspective view of a back plate assembly in accordance with the present invention, together with a motherboard, a CPU socket and a CPU.

FIG. 1 of the attached drawings shows a back plate assembly in accordance with the present invention, together with a motherboard 20, a central processing unit (CPU) socket 24 and a CPU 26. The socket 24 is mounted on the motherboard 20. The CPU 26 is attached on the socket 24. The motherboard 20 defines four through apertures 22 that surround the socket 24. A grounding pad 23 is formed on the motherboard 20 surrounding each aperture 22.

The back plate assembly comprises a cross-shaped back plate 40, a plurality of posts 60, and a plurality of clips 80. The back plate 40 comprises a rectangular central portion 42, and two pairs of fingers 44. The fingers 44 extend radially outwardly from corresponding corners of the central portion 42. A rectangular opening 46 is defined in the central portion 42, for improving elastic deformability of the back plate 40. Each finger 44 defines a through hole 48 in an end portion thereof, for extension of a corresponding post 60 therethrough.

Each post 60 comprises a head 62, a pole 64, and a connect portion 66 connected between the head 62 and the pole 64. A diameter of the connect portion 66 is less than a diameter of the head 62, and greater than a diameter of the pole 64. A threaded portion 68 is formed on a top end of the pole 64, for engaging with a heat sink (not shown) which is attached on the CPU 26.

Each clip 80 comprises a circular base 82. A star-shaped cutout 84 is stamped in a middle of the base 82. A plurality of inwardly extending resilient teeth 86 is thereby formed in the base 82. The teeth 86 also slant slightly upwardly from a periphery of the base 82 toward a middle of the cutout 84.

Figure 2:
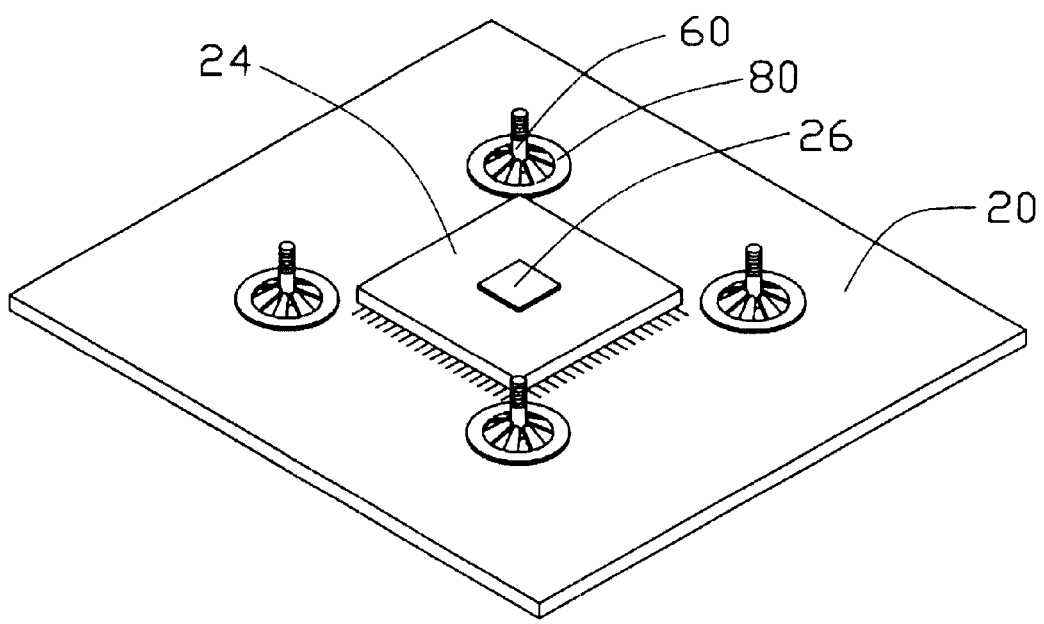
FIG. 2 is an assembled view of FIG. 1.
Figure 3:
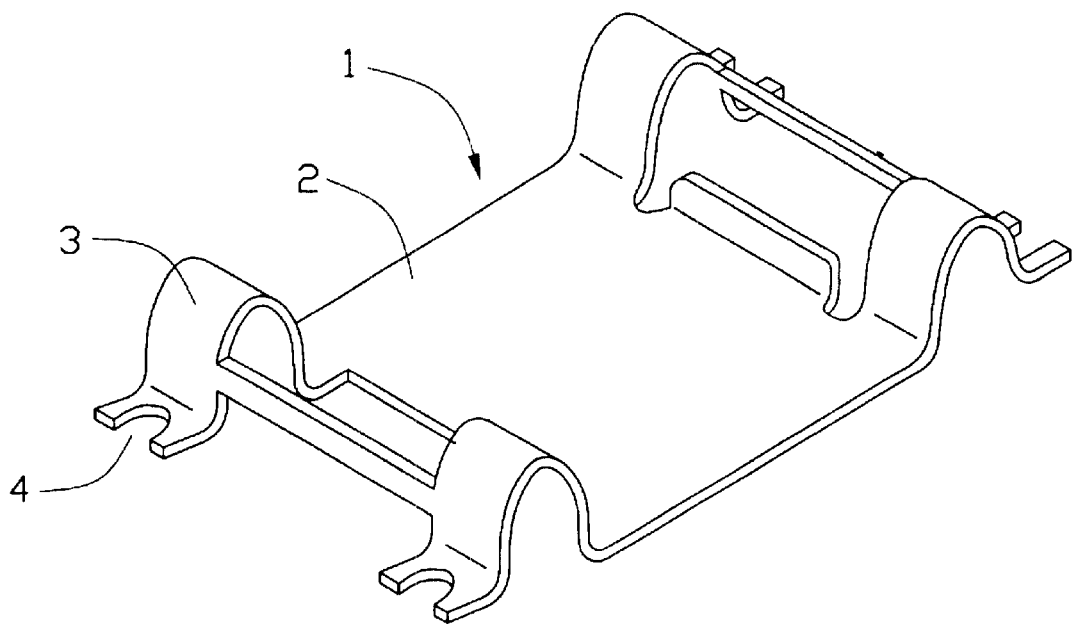
FIG. 3 is a perspective view of a conventional back plate.
Figure 4:
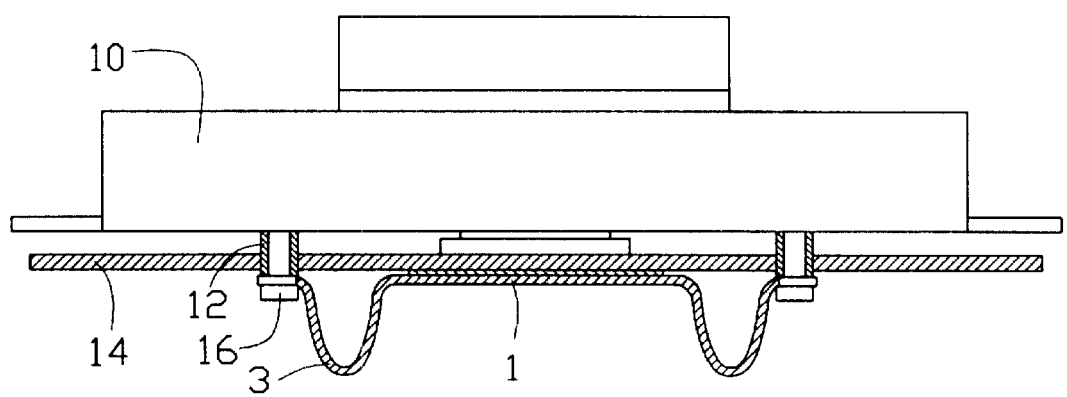
FIG. 4 is a schematic cross-sectional view of the back plate of FIG. 3 securing a heat sink assembly to a motherboard.

Referring also to FIG. 2, in assembly, the posts 60 are extended through the through holes 48 of the back plate 40. The connect portions 66 of the posts 60 are fixedly engaged in the corresponding through holes 48. The combined back plate 40 and posts 60 are attached to an underside of the motherboard 20. The poles 64 of the posts 60 are extended through the through apertures 22 of the motherboard 20. The clips 80 are then placed on the top ends of the poles 64 and pushed downwardly until the clips 80 abut a top surface of the motherboard 20. The poles 64 extend through the cutouts 84 of the clips 80 to outward and upwardly deform the teeth 86. The teeth 86 thereby securely retain the poles 64 in the motherboard 20. The back plate 40 is thus securely attached to the motherboard 20.

In addition to the function of securing, the clips 80 electrically contact the corresponding grounding pads 23, whereby electrostatic charge on the heat sink can be grounded via the poles 64 of the posts 60 and the clips 80.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. An electronic device assembly comprising:

a motherboard adapted for mounting an electronic device thereon, the motherboard defining a plurality of through apertures; and a back plate assembly adapted for attaching a heat dissipation assembly to the electronic device, the back plate assembly comprising:

a back plate attached on an underside of the motherboard to reinforce the motherboard, the back plate defining a plurality of through holes in communication with the through apertures;

a plurality of posts respectively extending through the through holes and apertures; and a plurality of clips respectively secured around the posts and abutting a top surface of the motherboard, each of the clips comprising a plurality of resilient teeth deformably retaining a corresponding post in the motherboard and thereby securely attaching the back plate to the motherboard.

2. The electronic device assembly as claimed in claim 1, wherein each of the clips defines a cutout in a middle portion thereof receiving a corresponding post, and the teeth slantingly extend toward a middle of the cutout.

3. The electronic device assembly as claimed in claim 1, wherein the back plate comprises a base and a plurality of fingers extending from the base, and the through holes are defined in the fingers respectively.

4. The electronic device assembly as claimed in claim 3, wherein the base defines an opening therein for improving elastic deformability of the base.

5. The electronic device assembly as claimed in claim 1, wherein each of the posts comprises a head abutting the underside of the motherboard, a connection portion fixedly engaging in a corresponding through hole, a pole surrounded and securely retained by a corresponding clip, and a threaded portion adapted for engaging with the heat dissipation assembly.

6. The electronic device assembly as claimed in claim 1, wherein the motherboard forms a plurality of grounding pads around the through apertures respectively, and the clips electrically contact the grounding pads respectively.

7. A method for securing a back plate to a motherboard, the motherboard defining a plurality of through apertures, the method comprising the steps of:

a) providing a back plate comprising a plurality of posts extending upwardly therefrom;

b) providing a plurality of clips, each of the clips defining a central cutout and forming a plurality of teeth extending toward a middle of the cutout;

c) attaching the back plate to an underside of the motherboard, with the posts extending through the through apertures respectively; and d) placing the clips on top ends of the posts respectively and downwardly pushing the clips until the clips abut the motherboard and the teeth deformably retain the posts, thereby securely attaching the back plate to the motherboard.

8. The method as claimed in claim 7, wherein step a) further comprises the step of: extending the posts through corresponding through holes defined in the back plate and fixedly engaging the posts in the through holes.

9. The method as claimed in claim 8, wherein the back plate comprises a base and a plurality of fingers extending from the base, and the through holes are defined in the fingers respectively.

10. The method as claimed in claim 7, wherein the cutout of each of the clips receives a corresponding post therethrough, and the teeth of each of the clips extend slantedly from a periphery of the clip toward a middle of the cutout.

11. The method as claimed in claim 7, wherein the motherboard forms a plurality of grounding pads around the through apertures, respectively, and in step d) the clips are downwardly pushed to electrically contact the grounding pads, respectively.

12. An electronic device assembly comprising:

a printed circuit board defining an electronic device mounting area with a plurality of through apertures thereabouts;

a back plate assembly for attaching a heat dissipation assembly to the electronic device, said back plate assembly comprising:

a back plate attached to an underside of said printed circuit board with a plurality of through holes in alignment with the corresponding through apertures, respectively;

a plurality of discrete posts upwardly extending through both the through holes and the corresponding through apertures with heads abutting against the back plate; and a plurality of clips each defining a cutout in a middle thereof with a plurality of inwardly resilient teeth extending from a periphery thereof toward said cutout; wherein each of said clips is positioned on the printed circuit board opposite to the head of the corresponding clips, and each of the posts extends through the cut out of the corresponding clip and retained by the corresponding teeth so as to have the head and the corresponding clip sandwich the printed circuit board and the back plate therebetween.

13. The assembly as claimed in claim 12, wherein each of said posts includes an engagement section exposed above the corresponding clip for engagement with the heat dissipation assembly.

* * * * *